(12) United States Patent
Drako

(10) Patent No.: US 7,254,038 B2
(45) Date of Patent: Aug. 7, 2007

(54) LOW PROFILE EXPANSION CARD FOR A SYSTEM

(75) Inventor: Dean M. Drako, Los Altos, CA (US)

(73) Assignee: Barracuda Networks, Inc., Campbell, CA (US)

( * ) Notice: Subject to any disclaimer, the term of this patent is extended or adjusted under 35 U.S.C. 154(b) by 50 days.

(21) Appl. No.: 11/111,319

(22) Filed: Apr. 21, 2005

(65) Prior Publication Data

US 2006/0238991 A1 Oct. 26, 2006

(51) Int. Cl.
*H05K 5/00* (2006.01)

(52) U.S. Cl. .................. 361/752; 361/797; 361/790

(58) Field of Classification Search ............... 361/752, 361/797, 800, 790, 788, 792
See application file for complete search history.

(56) References Cited

U.S. PATENT DOCUMENTS

| | | | |
|---|---|---|---|
| 5,531,611 A * | 7/1996 | Reed et al. ............... 439/540.1 |
| 5,870,027 A * | 2/1999 | Ho ........................... 340/693.5 |
| 5,921,816 A * | 7/1999 | Larabell ..................... 439/638 |
| 6,215,656 B1 * | 4/2001 | O'Neal et al. .............. 361/686 |
| 6,301,104 B1 * | 10/2001 | Hu .............................. 361/684 |
| 6,533,587 B1 | 3/2003 | Potter et al. .................. 439/65 |
| 6,754,084 B1 | 6/2004 | Bolognia et al. ........... 361/752 |

* cited by examiner

Primary Examiner—Tuan Dinh
Assistant Examiner—Hung S. Bui
(74) Attorney, Agent, or Firm—Law Offices of Terry McHugh

(57) ABSTRACT

A space-conscious system utilizes a low profile expansion card for providing a physical and electrical interface between a larger scale board, such as a motherboard, and an external component. The expansion card is mounted in a perpendicular orientation relative to the larger scale board, despite dimensional limitations with regard to such an orientation. The expansion card includes an input/output circuit board and a "signal-conduction extender" for enabling coupling to an external wall of the housing in which the expansion card and larger scale board are contained. In one possible embodiment, the housing is compatible with the 1U standard, the expansion card is an Ethernet card, and there is an adapter board at the front wall of the housing for routing connections from the expansion card to an exposed port. The invention allows a number of the expansion cards to be mounted in parallel within the same container.

14 Claims, 4 Drawing Sheets

LOW PROFILE EXPANSION CARD FOR A SYSTEM

TECHNICAL FIELD

The invention relates generally to circuit cards for connection to a larger scale board and more particularly to systems having small profile enclosures which house various components that include input/output cards.

BACKGROUND ART

In some businesses, there is an advantage to utilizing a computer system that allows existing services to be easily increased in capacity and enables new services to be easily introduced. For example, an Internet Service Provider (ISP) may maintain a server farm that is routinely expanded as the ISP gains subscribers. Online software vendors also benefit from the ability to readily expand capacity or capability.

An approach that facilitates capacity expansion and capability extension is rack mounting. FIG. 1 illustrates a rack mounted system 10 in which separate housings 12 contain sub-systems. A rack 14 includes slides which receive the housings on the basis of a particular standard. The sub-systems may be computers, computer appliances, or other cooperative equipment. The appliances may perform tasks such as spam filtering, network packet routing, firewall functions, or other functions that are needed by a particular enterprise.

A known industry standard for rack mounting is to provide measurements in 1U, 2U, 3U and 4U heights. A 1U height is approximately 1.6 inches (40.64 millimeters). The computers and other equipment are stacked on top of each other at a co-location facility, as shown in FIG. 1. The space at the facility can be expensive, so that the organization provided by the system is significant to the enterprise.

Within the various sub-systems, it is desirable to use a standard operating system (OS) and standard personal computer motherboards. The advantage is that application software and circuit boards are readily available from many suppliers in the market, if they are to be employed with the standard OS and motherboard. Thus, it is not necessary to design custom hardware. Only custom application software is needed in order to properly perform the operations required by a particular enterprise.

A difficulty is to provide all of the input/output functions while using standard motherboards. A motherboard typically has one or two Ethernet ports and has the other standard ports for a computer system. Additional ports are often needed for an appliance or for networking equipment. To add the additional ports to the system, an expansion card may be used or a custom motherboard may be designed and built. The custom motherboard is expensive and takes time to test and manufacture. Consequently, the preference is to utilize an expansion card. However, commercially available expansion cards are typically designed for use within a standard desktop computer and are approximately 4 inches (101.6 millimeters) in height (PCI and derivatives). Because the slots of the motherboard are designed to place the expansion cards in a vertical position, the cards cannot be used in a standard 1U chassis. FIG. 2 shows an example of an Ethernet card 16 that includes a port 18 and circuitry 20 that enables signal exchanges between circuitry on a motherboard (not shown) and an external system. An edge connector 22 on the card is mated to a slot of the motherboard. A metal bracket 24 is fixed to the back wall of the housing in which the Ethernet card is connected. Currently, a standard for an input/output card having a vertical orientation and a back-wall accessibility has been set for 2U-compatible chassis, but the standard is limited to such applications.

Riser cards allow the use of a standard-sized expansion card with a motherboard housed within a 1U chassis or a 2U chassis. A riser card is described in U.S. Pat. No. 6,533,587 to Potter et al. The riser card mates with the slot connector of the motherboard and includes a slot connector that permits the expansion card to reside in an orientation parallel to the motherboard, rather than perpendicular to the motherboard. Two such slot connectors may face in opposite directions from the riser card, so that the riser card permits two expansion cards to be located within the chassis.

Riser cards limit the number of expansion cards which may be installed. Because the riser cards place the expansion card or cards parallel to the motherboard, an expansion card may extend over slot connectors on the motherboard, preventing these slot connectors from being used. In addition, reliability and quality may suffer as a result of the need for the extra components and the additional connections. The number of input/output ports (such as Ethernet ports) may be increased by providing a DUAL or QUAD Ethernet adapter card, but these cards are sometimes cost prohibitive, since they require special hardware to multiplex the single expansion slot into the multiple input/output ports.

While known techniques operate reasonably well for their intended purpose, further improvements are desired.

SUMMARY OF THE INVENTION

The invention utilizes a low profile expansion card for providing an interface between a larger scale circuit board and an external component, so that the expansion card may be in a perpendicular orientation relative to the larger scale board despite dimensional limitations with regard to such an orientation. Then, a signal-conduction extender is used to enable off-card connection at a wall of the housing in which the larger scale board and the expansion card reside. For example, the signal-conduction extender may be a cable for input/output functions.

In one embodiment, the low profile expansion card is an input/output card for use in a 1U chassis. As a result, a standard mother-board may be used in a 1U appliance or a 1U networking device.

Rather than a port that is fixed to the expansion card, the signal-conduction extender enables an unconventional location of a port. For example, the expansion card may be an Ethernet card in which the Ethernet port is located at the front of the chassis, rather than the conventional back-wall location. Other applications include USB (Universal Serial Bus) cards, general networking cards, modem cards, Fibre channel cards, and ISCSI (Internet Small Computer Interface) cards.

An input/output adapter board may be included as part of the system, if needed. For a front-wall port, the adapter board may be mounted to the front wall, with a cable extending from the low profile expansion card to the adapter board. In an example embodiment, three low profile expansion cards are mounted to three adjacent slot connectors of a standard mother-board. The signal-conduction extender (e.g., cable) of each low profile expansion card is connected between the associated expansion card and the adapter board at the front of a 1U chassis. The number of ports on the adapter board is at least as great as the number of low profile expansion cards to be used.

An advantage of the invention is that the system provides cost savings, since a standard motherboard is used, rather than a custom motherboard. Simultaneously, a space savings is achieved. The number of input/output expansion cards may equal the number of available slots of the motherboard. Additionally, the input/output expansion cards connect directly to the motherboard, rather than being connected via a riser card or other intermediary.

DETAILED DESCRIPTION

Figure 3:
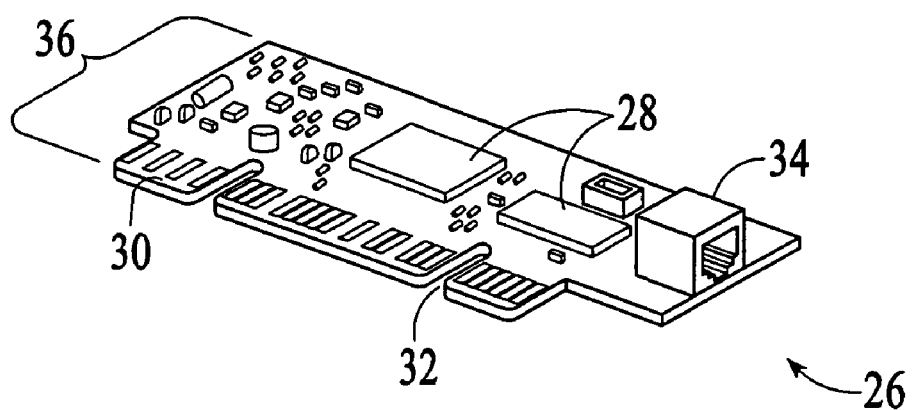
FIG. 3 is a perspective view of an input/output expansion card in accordance with one embodiment of the invention.

FIG. 3 illustrates a low profile expansion card 26 in accordance with one embodiment of the invention. The expansion card is an input/output card that includes circuitry 28 dedicated to enabling an interface between a large scale board (not shown) and an external component, such as a computer, computer appliance, piece of networking equipment, or similarly enabled device. In one preferred embodiment, the input/output card is an Ethernet card, but other embodiments are contemplated. As examples, the expansion card may be a USB card, a general networking card, a modem card, a Fibre channel card, or an ISCSI card. When installed in the housing of a component, the input/output card provides a transparent interface between the component and an external component. The circuitry 28 may include a processing unit and/or memory (e.g., random access memory), although the processing capability is not significant to the invention.

An edge connector 30 resides along one side of the low profile input/output card 26. The edge connector includes a number of metallic members that conduct signals when the edge connector is inserted into a slot connector of the larger scale board, such as a standard motherboard. The edge connector is generally continuous, but may include one or more gaps 32 that are cooperative with features of the edge connector to ensure that the expansion card is not improperly inserted into the edge connector.

As is known in the art, there are a number of alternative bus types for use by the larger scale board. The available bus types include PCI, PCI-X, PCI Express, ISA, EISA, and MCA. As one possibility, the low profile expansion card may be a PCI card using an industry standard 32-bit local bus that enables high throughput.

Figure 2:
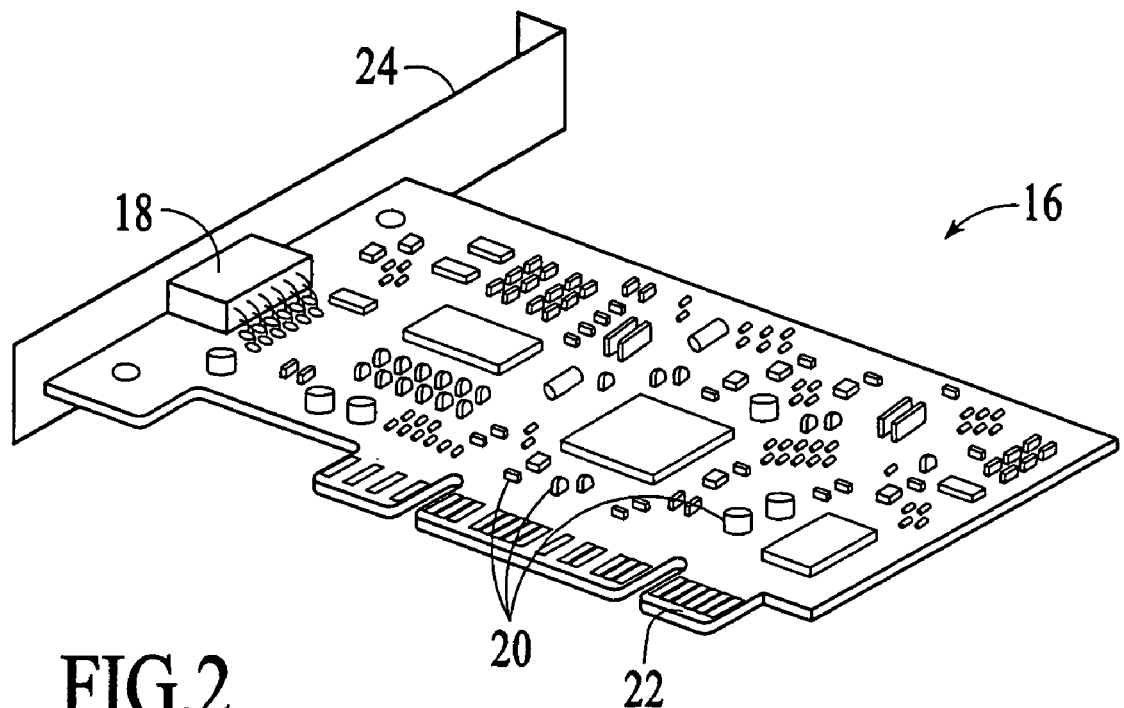
FIG. 2 is a perspective view of a prior art Ethernet card.

In addition to the edge connector 30, the low profile expansion card 26 includes an RJ-45 female connector 34. As will be explained more fully below, the connector is located forwardly within the housing when the card is inserted into the slot connector of the larger scale board. This forward location is the opposite of the conventional location, as can be seen when comparing FIGS. 2 and 3. In FIG. 2, the connector 18 is exposed at the back wall of the component when the prior art card is in use. On the other hand, the RJ-45 connector 34 of FIG. 3 is spaced apart from the rear wall.

The low profile expansion card 26 is perpendicular to the larger scale board when the edge connector 30 is seated within the slot connector of the larger scale board. In this perpendicular direction, the dimension 36 of the board is such that the edge of the board opposite to the edge connector 30 is closely adjacent to the housing. Thus, within a 1U chassis, the combination of the low profile expansion card 26, the thickness of the larger scale board, and mounting considerations must be less than the 1U standard (40.64 millimeters). In the preferred embodiment, the expansion card has a height of less than 1.3 inches (33.02 millimeters). When this height is combined with the preferred embodiment of a forward facing connector 34, the expansion card is a radical departure from the prior art.

The RJ-45 connector 34 provides a means to attach a "signal-conduction extender" for coupling the low profile expansion card 26 to a port at the wall of the chassis. The "signal-conduction extender" may simply be a flexible cable. As one alternative, one end of the cable may be fixed directly to the circuit board on which the circuitry 28 is mounted. Other alternatives would be to substitute the RJ-type connector with another known connector type. While concerns relating to positional tolerances would be introduced, another alternative would be to provide a "signal-conduction extender" that is rigid and elongated, rather than having the flexibility of a conventional cable.

Figure 4:
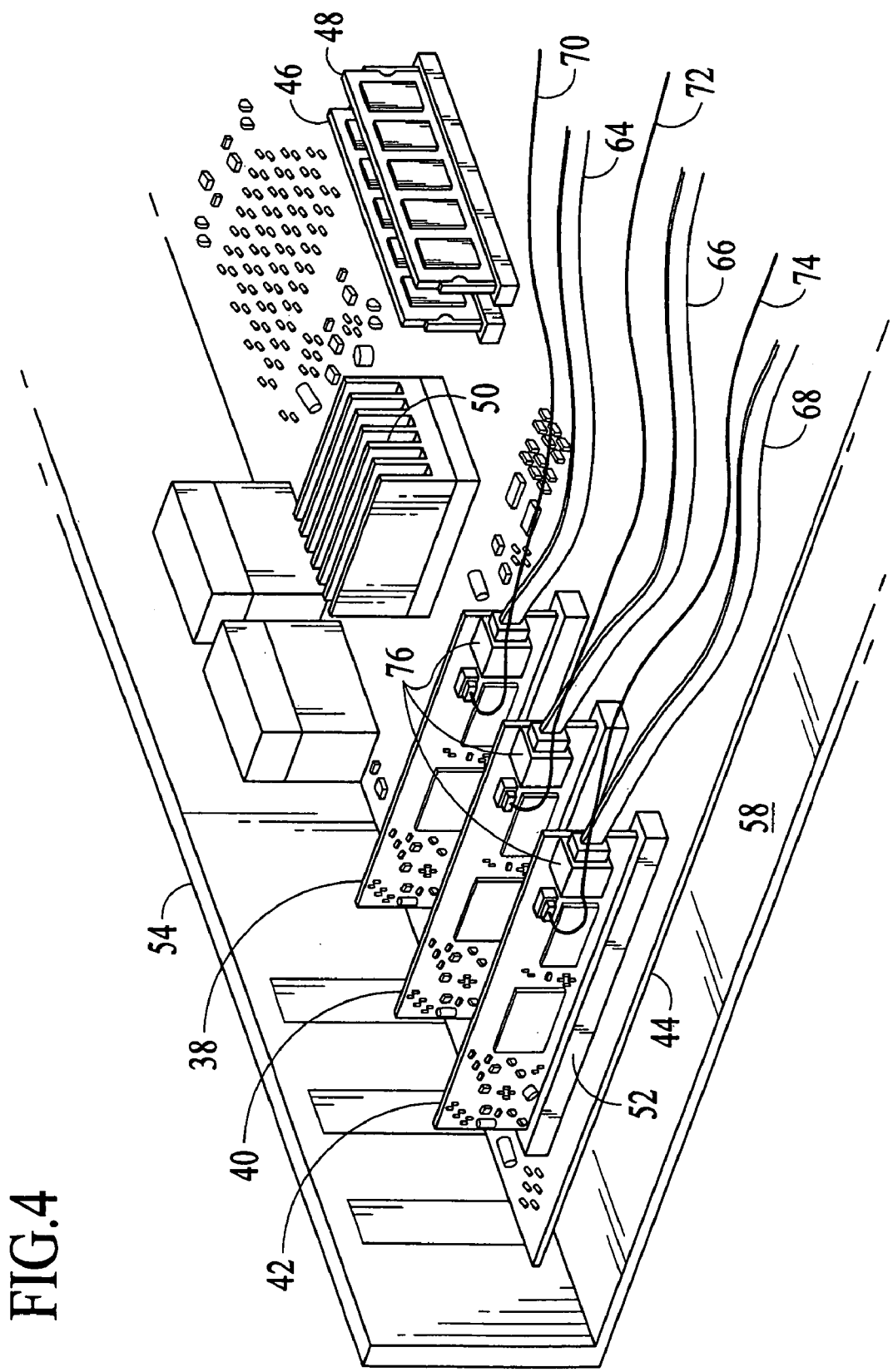
FIG. 4 is a perspective view of a 1U device having three input/output expansion cards of the type shown in FIG. 3.

Referring now to FIG. 4, three low profile expansion cards 38, 40 and 42 are shown as being connected in a perpendicular relationship to a larger scale board 44, which is a standard motherboard. In addition to the expansion cards, the motherboard is shown as including a pair of DIMM cards 46 and 48, a heat sink 50 for a central processing unit (CPU), and other standard components. The expansion cards are physically and electrically connected to the motherboard by slot connectors 52, such as PCI connectors.

The motherboard 44 and low profile expansion cards 38, 40 and 42 are contained within a housing that includes the back wall 54, side wall 56, and bottom 58 shown in FIG. 4. The top is removed, but would be in close proximity to the top edges of the expansion cards when included.

Figure 5:
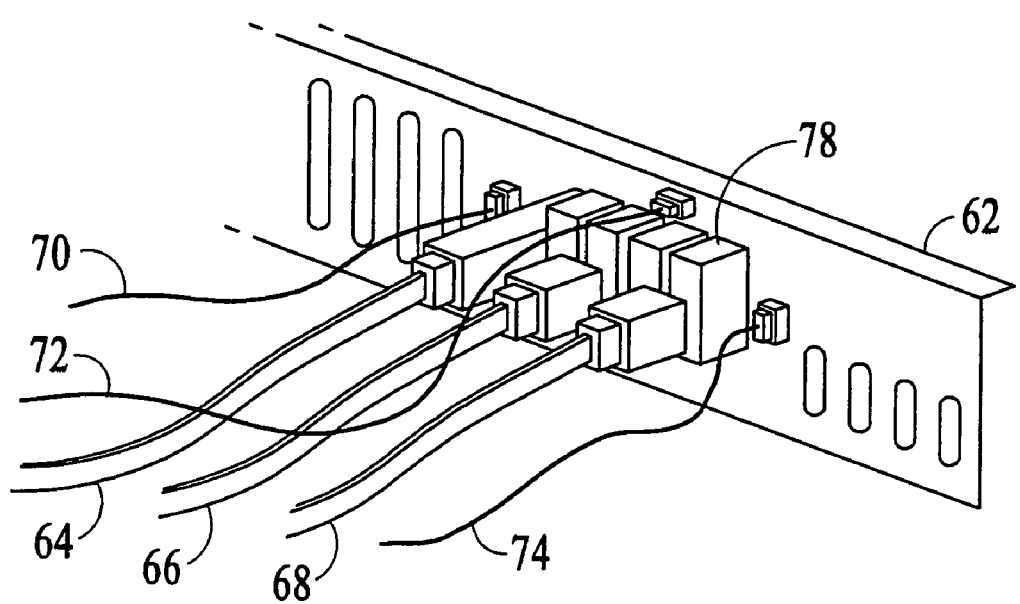
FIG. 5 is a perspective view of an adapter card on a wall of the 1U chassis of FIG. 4.

In some embodiments, an adapter board may be beneficial or even necessary in order to provide the desired connectivity arrangement at the wall of the housing. Referring now to FIG. 5, an adapter board 60 is shown as being affixed to a front wall 62 that is attachable to the other portions of the housing shown in FIG. 4.

Figure 6:
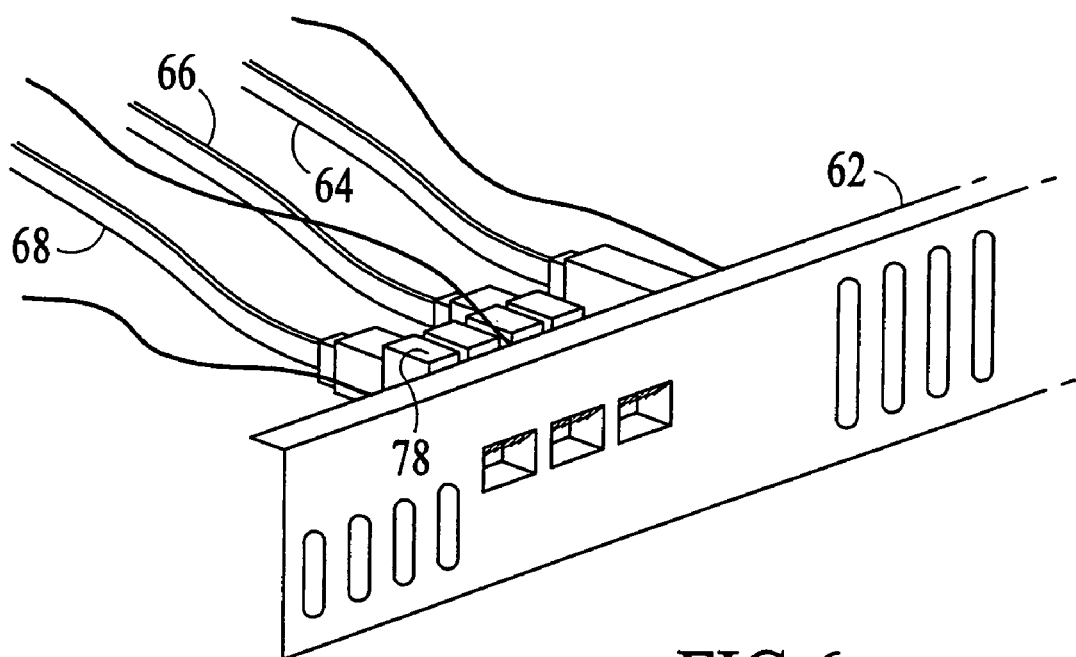
FIG. 6 is a front view of the wall of FIG. 5.

Comparing FIGS. 4 and 5, each low profile expansion card 38, 40 and 42 is linked to the adapter board 60 by a communication cable 64, 66 and 68 and a secondary cable 70, 72 and 74. The cables are standard in the art. The communication cables 64, 66 and 68 attach to rearward connectors 76 on the adapter board 60. Each rearward connector is uniquely associated with a forward connector 78 on the adapter board. As a result, signals to and from one of the communication cables are conducted through the associated forward and rearward connectors. As shown in FIG. 6, the forward connectors are exposed to allow users to insert input/output cables into the connectors. Thus, when the invention is used to provide Ethernet connectivity, three standard Ethernet cables may be connected to the three ports exposed at the front panel 62 of the housing.

While the adapter board 60 is shown as being connected to the front panel 62, the adapter board may be mounted to the back wall 54 of FIG. 4. Moreover, there may be embodiments in which the adapter board is not required.

Figure 1:
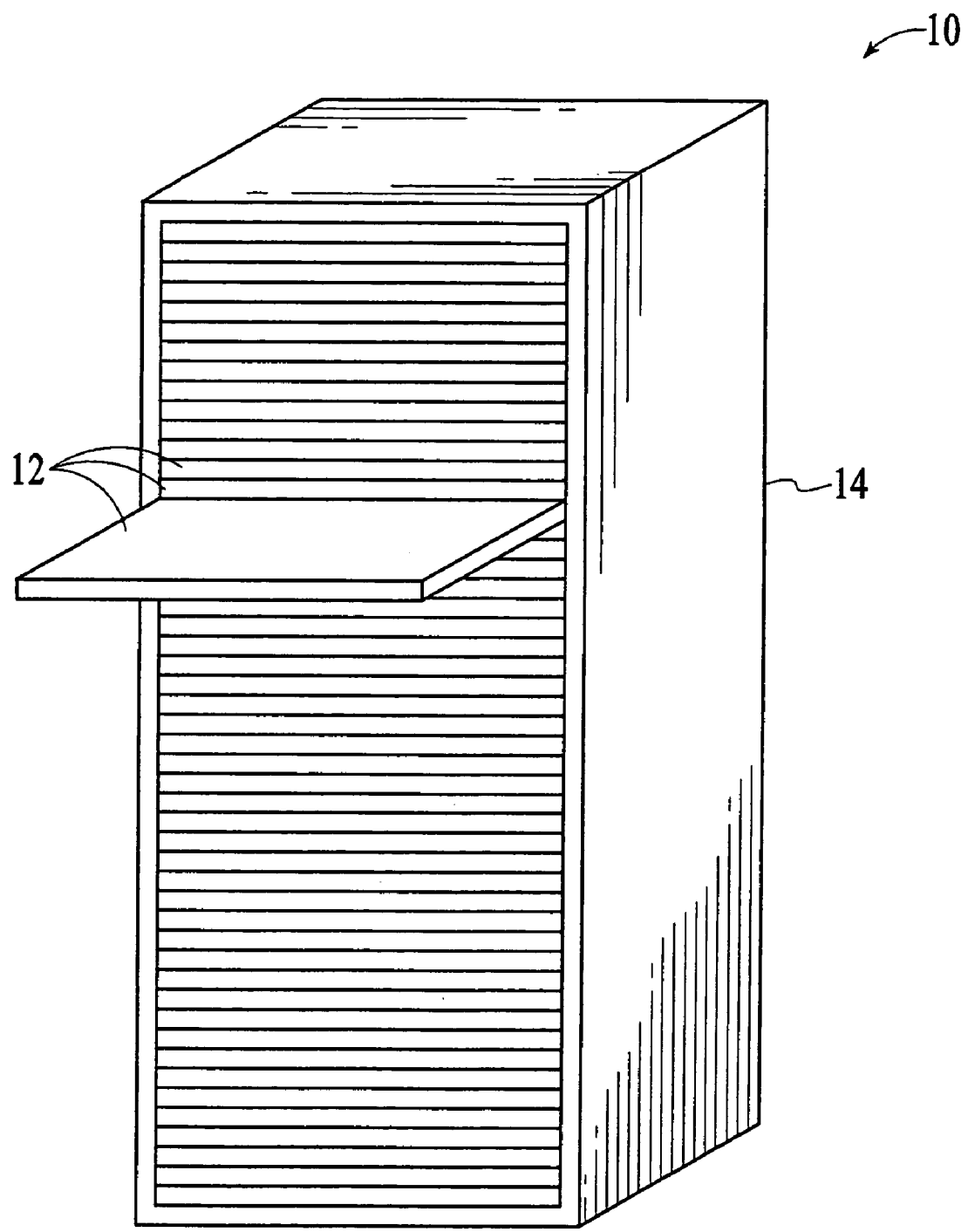
FIG. 1 is a perspective view of a rack-mounted system in which the present invention may be utilized.

The invention provides multiple input/output ports, such as Ethernet ports, without a significant increase in the cost of designing and fabricating circuit boards. The low profile expansion cards are dimensioned to mount perpendicularly to the larger scale board, even though the overall system is compact. For example, the invention may be used in the rack mount system of FIG. 1, wherein the separate housings 12 satisfy the 1U standard.

What is claimed is:

1. A system comprising:
    a 1U chassis having a front wall and a back wall;
    a circuit board having a plurality of connectors for releasably seating circuit cards adjacent to said back wall in an orientation that is generally perpendicular to said circuit board, said circuit board being housed within said 1U chassis;
    a plurality of input/output cards, each said input/output card being seated to one of said connectors to maintain said orientation; and
    an adapter board fixed at said front wall of said 1U chassis, said adapter board having a plurality of input/output ports, each said input/output port being coupled to an associated said input/output card to enable signal exchanges between said circuit board and an external system via said associated input/output card.

2. The system of claim 1 wherein said circuit board is a standard motherboard.

3. The system of claim 1 wherein each said input/output card is an Ethernet card, said Ethernet card being coupled to said associated input/output port by a cable.

4. The system of claim 3 wherein said Ethernet card is without a signal-exchange capability at said back wall of said 1U chassis, said back wall having a plurality of ports that are unrelated to said Ethernet card.

5. The system of claim 1 wherein said input/output card includes an edge connector configured to mate with said connectors of said circuit board.

6. The system of claim 1 further comprising a plurality of additional 1U standard components mounted within a rack.

7. The system of claim 1 wherein said circuit board includes circuitry and programming for enabling spam filtering for email messages.

8. A rack mounted system comprising:
    a rack having slides arranged to secure computer sub-systems housed within 1U chasses, said rack having a front side through which said computer sub-systems are received; and
    a stack of said computer sub-systems secured within said rack so as to remain within a closely spaced arrangement, wherein at least some of said computer sub-systems house:
        (a) a motherboard that is oriented perpendicular to said front side of said rack;
        (b) a low profile expansion card for providing an interface between said motherboard and an external component, said expansion card being a circuit board seated within a connector of said motherboard to extend perpendicular to said motherboard; and
        (c) a signal-conduction extender having a first end connected to said circuit board and having a second end spaced apart from said circuit board and said motherboard for enabling an off-board connection at a wall of said computer sub-system in which said signal-conduction extender is housed.

9. The rack mounted system of claim 8 wherein said signal-conduction extender is connected to an adapter board at a front wall of said computer sub-system in which said signal-conduction extender is housed, said front wall being exposed at said front side of said rack.

10. The rack mounted system of claim 8 wherein at least one said computer sub-system includes a plurality of low profile expansion cards in a side-by-side relationship, each said low profile expansion card being connected to a separate said signal-conduction extender.

11. The rack mounted system of claim 10 wherein said separate signal-conduction extenders connect to ports at said wall of said computer sub-system in which said separate signal-conduction extenders are housed.

12. The rack mounted system of claim 8 wherein said low profile expansion card is an Ethernet card that is specific to providing an Ethernet interface.

13. The rack mounted system of claim 12 wherein said Ethernet card is configured to be received within a slot connector of said motherboard and wherein said signal-conduction extender is attached to a port that is exposed at said front side of said rack.

14. The rack mounted system of claim 8 wherein said circuit board of each said low profile expansion board includes programming and circuitry for enabling spam filtering for email messages.

* * * * *